United States Patent [19]

Hung et al.

[11] Patent Number: 5,262,392
[45] Date of Patent: Nov. 16, 1993

[54] METHOD FOR PATTERNING METALLO-ORGANIC PRECURSOR FILM AND METHOD FOR PRODUCING A PATTERNED CERAMIC FILM AND FILM PRODUCTS

[75] Inventors: Liang-Sun Hung; Longru Zheng, both of Webster; Yann Hung, Rochester, all of N.Y.

[73] Assignee: Eastman Kodak Company, Rochester, N.Y.

[21] Appl. No.: 729,608

[22] Filed: Jul. 15, 1991

[51] Int. Cl.[5] .................. B05D 3/06; B05D 5/12; B44C 1/22; H01L 21/306

[52] U.S. Cl. ........................... 505/1; 427/504; 427/510; 427/525; 427/526; 427/533; 427/552; 427/63; 505/734; 505/742; 156/628; 156/633; 156/634

[58] Field of Search .............. 427/43.1, 44, 35, 36, 427/38, 53.1, 54.1, 56.1, 55, 496, 504, 508, 510, 525, 526, 533, 534, 535, 536, 537, 552, 63; 505/734, 735, 742, 725; 156/628, 633, 634, 643

[56] References Cited

U.S. PATENT DOCUMENTS

| | | |
|---|---|---|
| 4,289,845 | 9/1981 | Bowden et al. ............... 427/43.1 |
| 4,301,231 | 11/1981 | Atarashi et al. ............... 427/43.1 |
| 4,332,879 | 6/1982 | Pastor et al. ............... 427/43.1 |
| 4,362,598 | 12/1982 | Griffing ............... 427/43.1 |
| 4,383,026 | 5/1983 | Hall ............... 427/43.1 |
| 4,396,704 | 8/1983 | Taylor ............... 427/43.1 |
| 4,398,964 | 8/1983 | Malwah ............... 148/1.5 |
| 4,426,247 | 1/1984 | Tamamura et al. ............... 427/43.1 |
| 4,476,216 | 10/1984 | Tobias ............... 427/43.1 |
| 4,481,049 | 11/1984 | Reichmanis et al. ............... 427/43.1 |
| 4,589,961 | 5/1986 | Gershenson ............... 427/63 |
| 4,657,629 | 4/1987 | Bigelow ............... 427/43.1 |
| 4,715,929 | 12/1987 | Ogawa ............... 427/43.1 |
| 4,770,739 | 9/1988 | Orvek et al. ............... 427/43.1 |
| 4,863,556 | 9/1989 | Reichert ............... 156/628 |
| 4,913,769 | 4/1990 | Kanda et al. ............... 427/63 |
| 4,952,556 | 8/1990 | Mantese et al. ............... 505/1 |
| 4,956,335 | 9/1990 | Agostinelli et al. ............... 505/1 |
| 5,021,398 | 6/1991 | Sharma et al. ............... 505/1 |

FOREIGN PATENT DOCUMENTS 0426000 5/1991 European Pat. Off. .
2250517 6/1992 United Kingdom .

OTHER PUBLICATIONS

Applied Physics Letters, vol. 52, No. 20, May 16, 1988, New York, pp. 1741-1742, Mantese et al, "Use of ion beams to decompose metal organics into patterned thin-film superconductors".
L. D. Jackel et al. *Appl. Phys. Lett.*, vol. 39, Aug. 1, 1981, pp. 268-270.
M. E. Gross et al. *Appl. Phys. Lett.*, vol. 53, Aug. 29, 1988, pp. 802-804.
J. V. Mantese et al. *Appl. Phys. Lett.*, vol. 52, May 16, 1988, pp. 1741-1742.

*Primary Examiner*—Marianne Padgett
*Attorney, Agent, or Firm*—Robert Luke Walker

[57] ABSTRACT

A method for patterning precursor film, a product thereof, a method for preparing a patterned ceramic film and a processing workpiece. The method for patterning precursor film includes the steps of depositing a blocking layer over the precursor film, patterning the overlaid blocking layer to uncover portions of the precursor film, irradiating the patterned blocking layer and uncovered portions of the precursor film with a beam sufficiently energetic to radiation modify the full thickness of unmasked portions of the precursor film and insufficiently energetic to radiation modify portions of the precursor film covered by the blocking layer, and developing the precursor film. The blocking layer has a lesser thickness than the precursor film, but is sufficiently thick to block an irradiating beam having the minimal energy necessary to radiation modify the full thickness of the precursor layer.

6 Claims, 2 Drawing Sheets (A)

(B)

(C)

(D)

(E)

(F)

(G)

(H)

(I)

(J)

(K)

(L)

(M)

(N)

METHOD FOR PATTERNING METALLO-ORGANIC PERCURSOR FILM AND METHOD FOR PRODUCING A PATTERNED CERAMIC FILM AND FILM PRODUCTS

BACKGROUND OF THE INVENTION

The present invention pertains to ceramic films and more particularly pertains to a method for patterning metallo-organic precursor film and a method for producing a patterned ceramic film and film products.

Ceramic materials capable of exhibiting specialized properties, such as superconductivity and opto-electrical properties, have great potential in the form of films that are patterned to meet particular needs. The term "film" used herein, is intended to encompass both "thin films", for example, a film 0.1–2 micrometers thick, and "thick films", for example, a film 5–10 micrometers thick.

Conventional semiconductor materials are patterned by a variety of different procedures. One method used in the production of semiconductor layers involves the use of a layer of patterned resist as a stencil to transfer a pattern to an underlying layer. Malwah, M. L. in U.S. Pat. No. 4,398,964 describes such a method in which a thick patterned resist layer is used to block an ion beam and thus transfer a pattern, in a three layer structure. Reichert, U.S. Pat. No. 4,863,556 describes a similar method, in which a pattern is transferred from a photoresist, through an oxide layer to a dielectric layer by ion implantation. The energy of the ion beam and the thickness of the resist layer are such that the ion beam does not completely penetrate through the masking layer or the dielectric layer. The oxide layer, except where damaged by the ion beam, resists etching used to transfer the pattern to the dielectric.

These methods for patterning semiconductor materials, have a shortcoming that the resist layer is thick. Jackel et al in *Appl. Phys. Lett.* Vol. 39, Aug. 1, 1981, p. 268–270 notes that a thin layer of resist is desirable to reduce forward scatter and backscatter from the electron beam and describes a method, in which a pattern is formed in a thin, outer resist layer and then transferred through a germanium intermediate layer to an inner resist layer, which is used as a stencil for thermal evaporation of gold onto the substrate. The methods used for patterning semiconductor materials are not directly applicable to the patterning of metallo-organic precursor films. The most notable difficulty is interactions between precursor films and conventional resists and resist developers.

A number of methods, have been used for patterning metallo-organic precursors of Ceramic films. Mantese, J. V. et al in *Appl. Phys. Lett.* Vol. 52, May 16, 1988, p. 1741–1742 describe a method in which a substrate was coated with a 2.6 micron thick layer of metallo-organic precursor, a pattern was exposed in the precursor by means of a broad ion beam, which penetrated through the precursor film in a pattern defined by a stainless steel shadow mask, unexposed precursor was washed away with solvent, and then the remaining exposed precursor was pyrolized and annealed at high temperature to convert the precursor into a patterned ceramic film. Lines as narrow as 10 microns were produced, but the lines were noted as having the shortcoming of very nonuniform widths. Gross, M. E. et al in *Appl. Phys. Lett.* Vol. 53, Aug. 29, 1988, p. 802–804 describe a similar method, in which nonuniform line widths are not noted, however structures produced were of millimeter dimensions. The shortcomings of these methods, required use of a very accurate shadow mask and either very nonuniform or very large line widths were overcome by Mantese et al, U.S. Pat. No. 4,952,556 by substituting a focused beam for the broad beam and shadow mask. An ion beam, an electron beam and a laser beam were separately used to pattern precursor layers of a thickness of less than 3 to 4.4 micrometers. These focused beam techniques have the shortcomings of much slower processing speed and high capital investment. Another alternative method for the production of patterned ceramic films, which is described in Agostinelli et al U.S. Pat. No. 4,956,335, is a lift-off process in which a precursor layer is deposited over a patterned layer of copper oxide resist. The resist is then removed, leaving precursor in the former openings of the patterned resist layer. This method is subject to the shortcomings of leaving a lift-off layer between the precursor layer and the substrate, which may interact with the precursor layer at elevated temperatures.

It is therefore highly desirable to provide an improved method for patterning precursor film, an improved method for making a patterned ceramic film, and improved film products.

It is also highly desirable to provide an improved method for patterning precursor film, an improved method for making a patterned ceramic film, and improved film products, based upon the utilization of broad beam irradiation without the use of a shadow mask.

It is also highly desirable to provide an improved method for patterning precursor film, an improved method for making a patterned ceramic film, and improved film products, in which destructive interactions of interactive materials can be prevented.

It is also highly desirable to provide an improved method for patterning precursor film, an improved method for making a patterned ceramic film, and improved film products, which utilize a four layer structure on a substrate: precursor film, a protective layer to prevent etching of precursor film, a beam blocking layer, and over the beam blocking layer a resist layer.

It is finally highly desirable to provide an improved method for patterning precursor film, an improved method for making a patterned ceramic film, and improved film products.

SUMMARY OF THE INVENTION

It is an object of the invention to provide an improved method for patterning precursor film, an improved method for making a patterned ceramic film, and improved film products.

It is another object of the invention to provide an improved method for patterning precursor film, an improved method for making a patterned ceramic film, and improved film products, based upon the utilization of broad beam irradiation without the use of a shadow mask.

It is another object of the invention to provide an improved method for patterning precursor film, an improved method for making a patterned ceramic film, and improved film products, in which destructive interactions of interactive materials can be prevented.

It is another object of the invention to provide an improved method for patterning precursor film, an improved method for making a patterned ceramic film, and improved film products, which utilize a four layer structure on a substrate: precursor film, a protective layer to prevent etching of precursor film, a beam blocking layer, and over the beam blocking layer a resist layer.

It is finally an object of the invention to provide an improved method for patterning precursor film, an improved method for making a patterned ceramic film, and improved film products.

In the broader aspects of the invention there is provided a method for patterning precursor film, a product thereof, a method for preparing a patterned ceramic film and a processing workpiece. The method for patterning precursor film includes the steps of depositing a blocking layer over said precursor film, patterning the overlaid blocking layer to uncover portions of said precursor film, irradiating the patterned blocking layer and uncovered portions of the precursor film with a beam sufficiently energetic to radiation modify the full thickness of unmasked portions of the precursor film and insufficiently energetic to radiation modify portions of the precursor film covered by the blocking layer, and developing the precursor film. The blocking layer has a lesser thickness than the precursor film, but is sufficiently thick to block an irradiating beam having the minimal energy necessary to radiation modify the full thickness of the precursor layer.

BRIEF DESCRIPTION OF THE DRAWINGS

The present invention may be more readily understood by referring to the accompanied drawings, in which:

FIG. 1a(B) is a schematic diagram of a protective layer overlaying FIG. 1a(A).

FIG. 1a(C) is a schematic diagram of a blocking layer deposited on FIG. 1a(B).

FIG. 1a(D) is a schematic diagram of a resist layer deposited over FIG. 1a(C).

FIG. 1a(E) is a schematic diagram of FIG. 1a(D) being irradiated.

FIG. 1a(F) is a schematic diagram of FIG. 1a(E) after being developed.

FIG. 1b(H) is a schematic diagram of FIG. 1b(G) after being etched.

FIG. 1b(I) is a schematic diagram of FIG. 1b(H) after being developed.

FIG. 1b(J) is a schematic diagram of FIG. 1b(E) being irradiated.

FIG. 1b(K) is a schematic diagram of FIG. 1b(J) after being etched.

FIG. 1b(L) is a schematic diagram of FIG. 1a(K) after a solvent was used.

FIG. 1b(M) is a schematic diagram of FIG. 1b(L) after being developed.

FIG. 1b(N) is a schematic diagram of FIG. 1b(M) after being annealed.

DESCRIPTION OF A SPECIFIC EMBODIMENT

Figure 1:
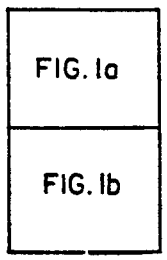
FIG. 1a(A) is a schematic diagram of a precursor film overlaying a substrate.
FIG. 1b(G) is a schematic diagram of FIG. 1a(F) being irradiated.
Figure 1A:
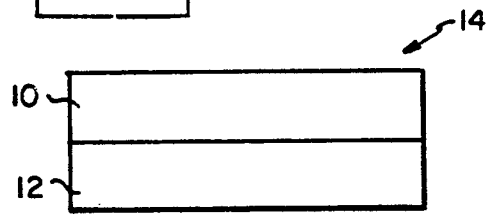
Figure 1A:
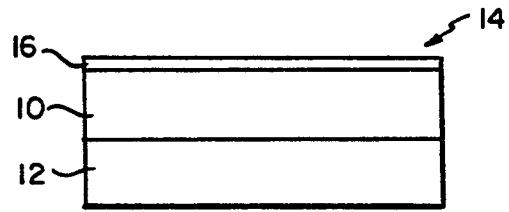
Figure 1A:
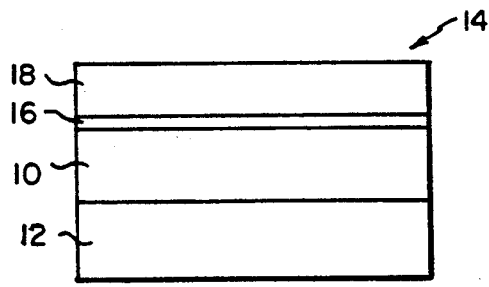
Figure 1A:
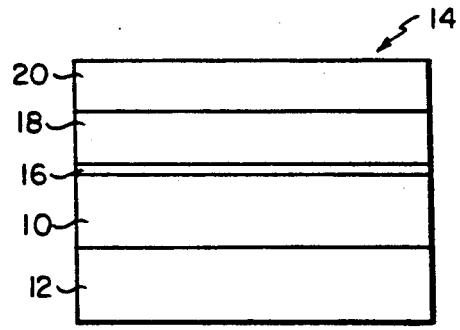
Figure 1A:
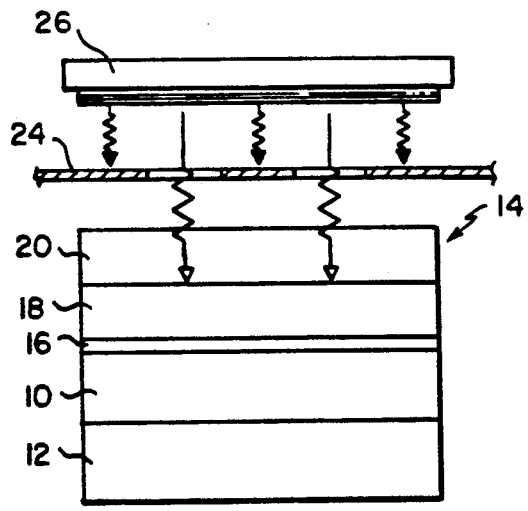
Figure 1A:
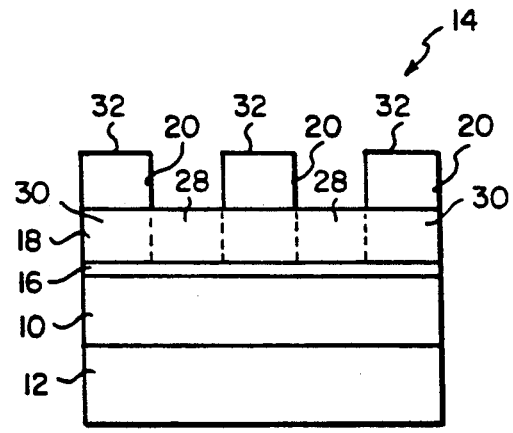
Figure 1B:
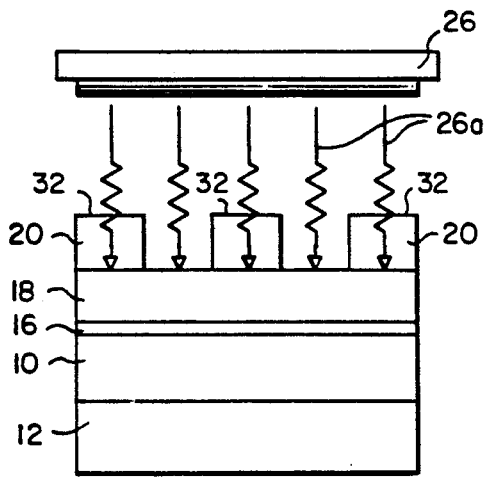
Figure 1B:
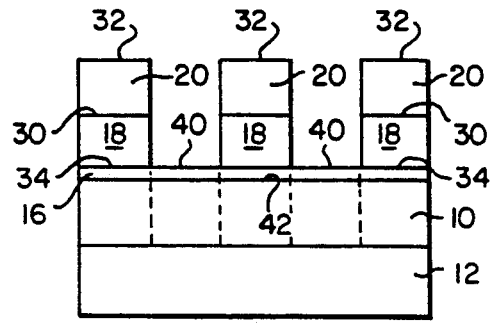
Figure 1B:
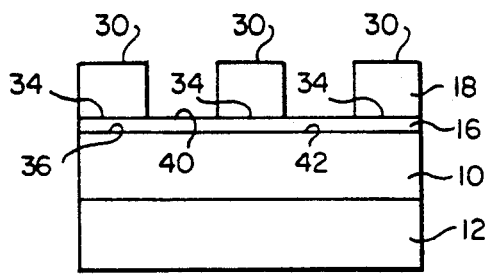
Figure 1B:
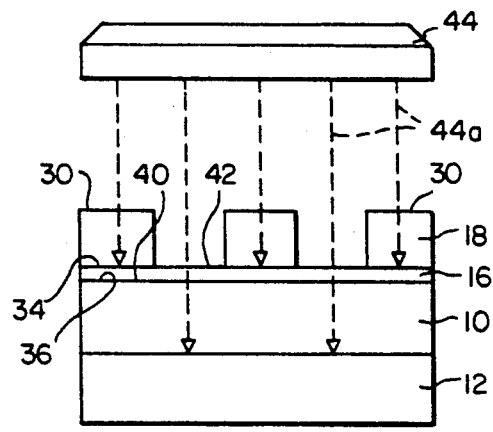
Figure 1B:
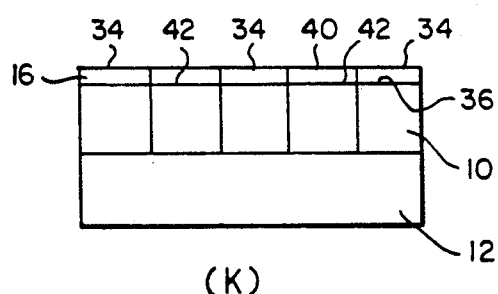
Figure 1B:
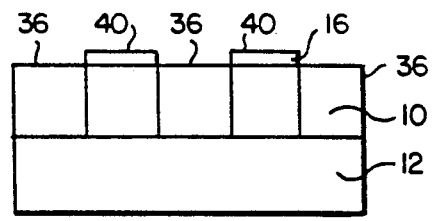
Figure 1B:
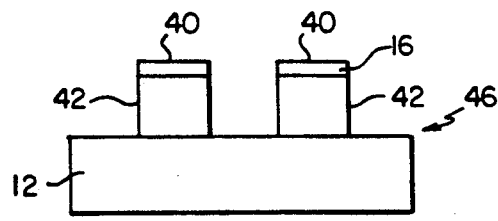
Figure 1B:
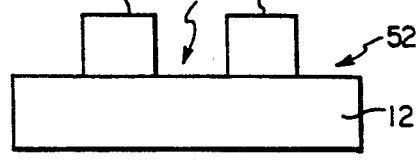

An embodiment of the method for producing a patterned ceramic film of the invention is disclosed schematically in the figure. In A, a metallo-organic precursor film 10 was layered over a substrate 12. Substrate 12 and any overlying layers are referred to collectively herein as workpiece 14. In B, a protective layer 16 was deposited over precursor film 10 and substrate 12. In C, a masking layer or blocking layer 18 was deposited over protective layer 16, precursor film 10 and substrate 12. In D, a resist layer 20 was deposited over blocking layer 18, protective layer 16, precursor film 10 and substrate 12, resulting in the work article 22 of the invention, which has a four layer structure overlying substrate 12.

In E, a pattern was then exposed on resist layer 20 using photo-lithography, with a photo mask 24 interposed to between a lithographic light source 26 and workpiece 14. In F, resist layer 20 was developed converting a latent image into a pattern and resulting in blocking layer 18 having uncovered portions 28 and covered or remaining portions 30. In G, remaining portions 32 of resist layer 20 were exposed, but not developed. This exposure was a "blanket exposure" of light 26a. No photo mask 24 was interposed between light source 26 and remaining portions of resist layer 20 and uncovered portions 28 of blocking layer 18. In H, uncovered portions 28 of blocking layer 18 were etched, revealing portions 40 of protective layer 16 and dividing protective layer 16 and precursor film 10 into blocked portions 34,36, respectively, covered by remaining portions 30 of blocking layer 18 and unblocked portions 40,42, respectively. Precursor film 10 remained covered by protective layer 16. In I, remaining portions 32 of resist layer 20 were developed. In J, a highly energetic ion beam 44a, electron beam 44a or laser beam 44a, from a beam source 44, irradiated remaining portions 30 of blocking layer 18 and unblocked portions 40,42 of protective layer 16 and precursor film 10, respectively, altering the relative removal characteristics of blocked and unblocked portions 34,40 and 36,42, respectively. In K, remaining portions 30 of blocking layer 18 were etched. Precursor film 10 remained covered by protective layer 16. In L, blocked portions 34 of protective layer 16 were removed. In M, precursor film 10 was developed, removing blocked portions 36 of precursor film 10 to provide a patterned precursor film product 46 and complete the method of patterning precursor film of the invention. Product 46, has substrate 12 overlaid with unblocked portions 42 of precursor film 10. Unblocked portions 42 are separated by spaces 48. Remaining on unblocked portions 42 of precursor film 10 are unblocked portions 40 of protective layer 16. In the disclosed embodiment of the method of producing a patterned ceramic film of the invention, product 46, as shown in N, was annealed in an oxidizing atmosphere, converting unblocked portions 42 of precursor film 10 to ceramic film 50 and removing blocked portions 40 of protective layer 16 to provide a patterned ceramic film product 52. The process of the invention is not limited to a single iteration and, it is envisioned, can be repeated using patterned ceramic film product 52 or patterned precursor film product 46 as substrate 12 for additional iterations.

The invention is not limited to any particular metalloorganic precursor film and can utilize any metalloorganic decomposition film which can be patterned and converted into a ceramic film. For example, 2-ethylhexanoates, octanoates, resinates, oleates, naphthenates and heptanoates can be used. These materials have similar solubilities with solvents such as 2-ethylhexanoic acid, toluene, and xylene and similar interactions with solvents such as acetone, and methanol. Precursor film 10 must be capable of being incorporated in work article 22; must be radiation modified by a selected beam 44a; must be capable of patterning by the method of the invention and must be capable of conversion into the desired ceramic film 50. The particular precursor film used is selected on the basis of a desired end use of the ceramic film. Ceramics capable of exhibiting superconductivity that may be produced include cuprates such as rare earth alkaline earth copper oxides (referred to as "RAC" in U.S. Pat. No. 4,880,770 to Mir et al), $YBa_2Cu_3O_{7-x}$, ($x=0-0.6$) and related materials including lanthanides except Ce, Pr, Pm; materials of the Bi—Sr—Ca—Cu—O— family such as $Bi_2Sr_2CaCu_2O_8$ and $Bi_2Sr_2Ca_2Cu_3O_{10}$; materials of the Tl—Ba—Ca—Cu—O— family such as $Tl_2Ba_2CaCu_2$ Oxide and $Tl_2Ba_2Ca_2Cu_3$ Oxide; and $K_2NiF_4$ type materials such as $La_{2-x}Sr_xCu$ Oxide. Materials for ferroelectric applications include PLZT materials, which have the general formula $Pb_{1-x}La_x(Zr_yTi_{1-y})_{1-x/4}O_3$, such as PZT ($PbZr_xTi_{1-x}O_3$); $BaTiO_3$; and $K(Ta_xNb_{1-x})O_3$. Materials for electro-optic applications such as $LiNbO_3$, $LiTaO_3$, $KNbO_3$, ZnO, and PLZT materials. Non-linear optical materials such as $LiNbO_3$, $LiTaO_3$, $KNbO_3$, KTP ($KTiPO_4$), BBO (Beta Barium Borate). Photorefractive materials include $BaTiO_3$, SBN (Strontium barium Niobate), and $Fe:LiNbO_3$. Metals include Au, Pt and Ag. Insulating oxides include $SrTiO_3$, MgO, and $ZrO_2$.

The invention is not limited as to the manner of depositing precursor film 10 and other layers 16,18,20 on substrate 12, however, in a particular embodiment of the invention disclosed herein, a precursor film solution is layered over substrate 12 by spin coating and is then prebaked to remove the solvent at a temperature below the annealing temperature at which the precursor changes into ceramic.

Substrate 12 provides physical support and is selected on the basis of the capability of withstanding the heating step necessary to produce the ceramic film 50, overall compatibility with the metallo-organic precursor and ceramic film and resistance to degradation by steps of the methods, for example, etching. Substrate 12 can be selected from a wide variety of materials, in a wide variety of forms such as monocrystalline and polycrystalline solids and multilayer composites. Examples of materials suitable for use in substrate 12, in addition to silicon, are: quartz ($SiO_2$), silicon nitride, magnesium oxide (MgO(xtal)), strontium titanate, germanium, gallium arsenide, alumina (polycrystalline $Al_2O_3$ or sapphire), and metals. Substrate 12 can be patterned ceramic film product 52 or patterned precursor film product 46. Substrate 12 can include a barrier layer on which precursor film 10 is deposited, such as the barrier layers disclosed in Agostinelli et al, U.S. Pat. No. 4,950,643.

During the irradiation step of the methods of the invention, beam 44a causes a radiation induced modification in uncovered or unblocked portions 42 of precursor film 10, by changing the solubility of precursor film 10 in a particular solvent to the extent that unmodified or blocked portions 36 of precursor film 10 can be completely washed away from radiation modified or unblocked portions 42, using a particular solvent and conditions, with no deleterious effects on radiation modified portions 42. This "insolubilizing" extends sufficiently through precursor film 10 so as to prevent undercutting when precursor film 10 is developed, that is, washed with the solvent to remove unmodified portions 36 of precursor layer 10. A beam 44a, which has this effect on unblocked portions 42 of precursor layer 10, is described herein as "penetrating" to the full depth of unblocked portions 42. Similarly a beam 44a is described herein as being "blocked" by blocking layer 18 on the basis that covered portions 36 of precursor film 10 do not exhibit a change in solubility after the irradiation step. The same kind of insolubilizing occurs in unblocked portions 40 of protective layer 16, with the result that blocked portions 34 of protective layer 16 are washed away by solvent during a removal step, but unblocked portions 40 are radiation modified and are not removable by the same solvent. Unblocked portions 40 of protective layer 16 are removed by annealing of the patterned precursor film product 46.

The maximum thickness for precursor film 10 is determined, insofar as is known, by the capability of beam 44a to penetrate to the full depth of unblocked portions 42 of precursor film 10. A preferred thickness for precursor film 10 is between about 2 and about 5 micrometers when using a 200–300 kV implantor.

Beam 44a is an ion beam or a beam of some other form of corpuscular or wave-like radiant energy, such as noncoherent infrared radiation, coherent radiation as produced by lasers, electron beam, and neutron radiation. Beam 44a can be afocal or unfocused and, desirably, has a broad beam diameter at the range of work article 22, such that beam 44a can evenly irradiate work article 22, either without scanning or with a minimum amount of scanning. A beam 44a having a narrow beam diameter is usable, but undesirably slow. Beam 44a can, for example, be a beam provided by a low energy ion implanter, of energetic boron ions ($B^+$ and $B^{+2}$) having a beam energy between about 10 and about 400 keV and having an ion dosage of between about $10^{13}$ and about $10^{16}$ ions per square centimeter. A high energy ion implanter can also be used to provide a beam 44a having an energy of up to several MeV. Alternative ions include: proton, oxygen ($O^+$ and $O^{+2}$), gallium ($Ga^+$), phosphorus ($P^+$ and $P^{+2}$), and silicon ($Si^+$ and $Si^{+2}$). Other suitable ions include those of helium, nitrogen, neon and aluminum.

The exact nature of the radiation modification of unblocked portions 40,42 of protective layer 16 and precursor film 10, respectively, is not fully understood. Although the invention is not limited by any particular theory, the nature of the radiation modification can be theorized. The highly energetic beams may break carbon bonds of protective layer 16 and of the metallo-organic material of precursor film 10 and volatilize breakdown product, leaving behind insoluble material. It is believed that the energy transfer, in the case of a particle beam 44a, reflects implantation on a gross scale throughout the entire thickness of precursor film 10 and accompanying decomposition of precursor film 10. It is believed that the energy transfer, in the case of a non-particulate beam 44a such as a laser beam, would reflect a more complex interaction, in which decomposition effects penetrate to the full depth of precursor film 10, but photons may or may not.

Blocking layer 18, separates precursor film 10 and protective layer 16 from resist layer 20 and during the irradiating step of the methods of the invention, must block a beam 44a sufficiently energetic to radiation modify the full thickness of unblocked portions 42 of precursor film 10 after passing through unblocked portions 40 of protective layer 16. The material selected for blocking layer 18 must also be removable under etching conditions insufficient to etch through unblocked portions 40 of protective layer 16. The thickness of blocking layer 18 is less than the thickness of precursor film 10 and blocking layer 18 has a density per unit thickness greater than the density per unit thickness of precursor film 10. Blocking layer 18 is desirably heavy metal and more desirably is a layer of elemental silver. Such a layer can be prepared by electron beam or resistive heating evaporation of elemental silver onto protective layer 16 or by sputtering or by spin coating of a silver precursor.

Protective layer 16 is disposed between blocking layer 18 and precursor film 10. Protective layer 16 is resistant to the etching used to remove blocking layer 18 and thus prevents the etching steps from degrading precursor film 10, which would be significantly degraded by etching if left uncovered. In an example of embodiments of the invention disclosed herein, etching of blocking layer 18 is performed by immersion in 50% volume/volume nitric acid for 5 seconds. Protective layer 16 has the characteristic of retaining integrity during the etching process. Protective layer 16 also functions as a buffer layer to reduce the effect of sputtered atoms from precursor layer 10. Protective layer 16, in addition, acts as a separator between precursor film 10 and blocking layer 18, in case of incompatibility, such as non-adherence or undesirable side reactions or the like. Protective layer is removable by a solvent which does not degrade the performance of precursor film 10. An example of a material useful for protective layer 16 is positive photoresist marketed under the trademark PPH 3135 by Chemtech Industries, Inc. of Gardena, Calif. PPH 3135 meets the characteristics of protective layer 16 indicated above and is soluble in a solvent mixture having one part 2-ethylhexanoic acid to 100 parts of acetone on a volume/volume basis.

Since the photosensitive characteristics of the material used as protective layer 16 are not utilized, it is not relevant to the methods of the invention as to whether the material is a positive or negative photoresist. If protective layer 16 is a material that is subject to exposure by the exposure method used for resist layer 20, for example, both are photoresists, and that exposure would cause an undesirable change in protective layer 16, such as a change in solubility in a selected solvent, then unblocked portions 40 of protective layer 16 must be protected during the exposure of remaining portions 32 of resist layer 20. That protection can be provided by retaining portions 28 of blocking layer 18 over unblocked portions 40 of protective layer 16 during resist layer exposure steps. This is done by exposing a pattern onto resist layer 20, then developing the pattern, then exposing the remaining portions 32 of resist layer 20 and then removing uncovered portions 28 of blocking layer 18. It is desirable that the thickness of protective layer 16 be minimized in order to keep the separation between masking portions 30 of blocking layer 18 and blocked portions 36 of precursor film 10 at a minimum.

Resist layer 20 is a conventional photoresist, which is compatible with blocking layer 18. A pattern is produced in resist layer 20 using a lithographic light source 26 to provide radiation 26a, which passes through openings in photo mask 24 and exposes the pattern. An example of a lithographic light source 26 is a Model 8160 Exposure Station from Oriel Corporation of Stratford, Conn. An example exposure is 15-20 milliwatts/square centimeter for 10-20 seconds. Equivalent radiation sources and equivalent exposures are well known to those skilled in the art. After the exposure, which produces a latent image, resist layer 20 is developed by washing with solvent to expose a pattern, in which portions 28 of blocking layer 18 are uncovered and other portions 30 remain covered by resist layer 20.

Workpiece 14 is next subject to a blanket exposure, in which remaining portions 32 of resist layer 20 and uncover portions 30 of blocking layer 18 are subject to radiation 26a from light source 26, without an interposed photo mask 24.

It is necessary that the development procedure for resist layer 20 not appreciably degrade blocking layer 18. Suitable materials for resist layer 20 and suitable solvents for removal of resist layer 20 for embodiments of the invention in which blocking layer 18 is elemental silver include: positive photoresists marketed under the trademark 809 by Eastman Kodak Company of Rochester, N.Y.; PPH 3135 by Chemtech Industries Inc. of Gardena California and the AZ TM series by American Hoechst Corporation of Somerville, N.J.

The work article 22 of the invention has a four layered structure overlying substrate 12: precursor film 10, covered by protective layer 16, in turn covered by blocking layer 18, in turn covered by resist layer 20. It is envisioned that the methods of the invention could be divided between different manufacturers. A first manufacturer could produce work article 22 for a second manufacturer who would complete a method of the invention. Alternatively a first manufacturer could produce work article 22 for the second manufacturer who would expose a pattern in the resist layer and ship the exposed work article back to the first manufacturer, who would then complete a method of the invention. The latter approach would provide economies of scale in combination with small production runs of different product films and could be practiced so as to protect the secrecy of the second manufacturers' product.

The following examples and comparative examples are presented for a further understanding of the invention:

PREPARATION OF PRECURSOR SOLUTION FOR $Bi_2Sr_2CaCu_2O_{8+x}$

A precursor solution for $Bi_2Sr_2CaCu_2O_{8+x}$ was prepared by the method disclosed in U.S. Pat. Nos. 4,950,643 and 4,956,335, both Agostinelli et al, which are incorporated herein by reference. That method is restated below:

Bi-P1. Bismuth 2-ethylhexanoate

Solid bismuth oxide (20.0 grams) was mixed with 2-ethylhexanoic acid (25.0 grams). The reaction mixture was heated to approximately 120 degrees C. A few drops of ammonium hydroxide (30% $NH_3/H_2O$) were added to speed up the reaction. The reaction mixture was then refluxed for 4 hours, filtered, dried with molecular sieves and concentrated. Analysis showed 27.9% $Bi_2O_3$ residue (24.3% Bi) by weight.

Ca-P1. Calcium 2-ethylhexanoate

Calcium carbonate was treated with an excess of 2-ethylhexanoic acid and xylene as needed at 120 degrees C. for 18 hours. The mixture was then filtered and dried with molecular sieves, concentrated and filtered. Analysis showed a residue of 4.58% CaO (3.27% Ca) by weight.

Cu-P1. Copper 2-ethylhexanoate

Copper acetate (available from Baker, as 1766-1, 31.8% Cu by weight) was reacted with 2-ethylhexanoic acid by mixing copper acetate (2.0 grams) into 2-ethylhexanoic acid (8.0 grams) and heating to the boiling point for 5 minutes in an open vessel. Enough 2-ethylhexanoic acid was added back to cancel weight lost during reaction to return to 10.0 grams of a solution having 6.36% Cu by weight.

Sr-P1. Strontium cyclohexanebutyrate

This compound is available commercially in high quality from Eastman Chemicals Division of Eastman Kodak Company of Rochester, N.Y. It is supplied with an assay, which indicated a strontium concentration of 19.4% by weight for the lot which was used.

Precursor solution

Bi-P1 (2.0 grams) was mixed with Ca-P1 (1.43 grams) and Cu-P1 (2.32 grams). These three solutions are miscible and a stable solution was formed. To this was added Sr-P1 (1.05 grams) and the reaction mixture was heated to the boiling point resulting in a stable blue solution. To this solution was added rosin (0.5 grams, available from Eastman Chemicals Division of Eastman Kodak Company of Rochester, N.Y., as Rosin 2315) and the reaction mixture was heated gently to get all the rosin in solution and filtered. The resulting stable precursor solution had excellent rheological properties.

PREPARATION OF PRECURSOR SOLUTION FOR $Pb(Zr_{0.47}T_{0.53})$

A precursor solution for $Pb(Zr_{0.47}T_{0.53})$ was prepared by the following method.

Zi-P1. Zirconium Precursor Solution

Toluene (70 milliliters) was combined with zirconium n-propoxide (20 grams) and neodecanoic acid (22 grams). Zirconium n-propoxide is available commercially from Alfa Chemicals of Ward Hill, Mass. The reaction solution was then refluxed under argon for 4.5 hours. Solvent was removed by rotary evaporation to yield a zirconium reaction mixture: a viscous liquid. Abietic acid (1.0 grams), available commercially from Eastman Chemicals Division of Eastman Kodak Company of Rochester, N.Y.; was dissolved in toluene (2.6 grams) and butyl alcohol (1.64 grams) with heating. Zirconium reaction mixture (4.4 grams) was added and gently heated for 15 minutes, cooled to room temperature and filtered with a 0.65 micrometer nylon membrane filter to yield the zirconium precursor solution, which had a Zr content of 9.87 percent as determined by thermal gravimetric analysis (TGA) using a 951 Thermogravimetric Analyzer by DuPont Instruments.

Ti-P1. Titanium 2-ethylhexanoate

Titanium tetrabutoxide was added to an excess of 2-ethylhexanoic acid then filtering to yield a titanium precursor solution having 5.37 percent Ti as determined by TGA.

Pb-P1. Lead Resinate

Lead precursor solution (Pb-T1) was lead resinate, which is available commercially from Engelhard Corporation of East Newark, N.J. and contains 27.8 percent Pb.

Precursor Solution $Pb(Zr_{0.47}T_{0.53})$ precursor solution was prepared by mixing Zr-P1 (4.62 grams) with Ti-P1 (4.02 grams) and Pb-P1 (7.03 grams). To that solution was added 2-ethyhexanoic acid (1.56 grams) and rosin (1.52 grams), available from Eastman Kodak Company. The reaction mixture was heated to place all the rosin in solution and then filtered to provide the $Pb(Zr_{0.47}T_{0.53})$ precursor solution.

EXAMPLE 1

Precursor solution for $Bi_2Sr_2CaCu_2O_{8+x}$ was spin coated on Si (100) at 4000 revolutions per minute and baked at 150 degrees C. for 20 minutes to provide precursor film having a thickness of 2.7 microns. All spin coating described herein was performed on a Spinner by Headway Research Inc. of Garland, Tex. Precursor solution was diluted with 2-ethylhexanoic acid as necessary to produce precursor film of the indicated thickness. Protective layer was then prepared by spin coating over precursor film, at 8000 revolutions per minute for 30 seconds, a PPH-3135 photoresist having a viscosity of 4.5 cst followed by baking at 90 degrees C. for 30 minutes, to provide a 0.3 micrometer thick protective layer. Blocking layer was then prepared by electron beam evaporation of elemental silver onto protective layer to provide a 0.9 micrometer thick blocking layer. Resist layer was then prepared by spin coating over blocking layer, at 5000 revolutions per minute for 30 seconds, Kodak 809 photoresist having a viscosity of 28%, followed by baking at 90 degrees C. for 30 minutes, to provide a 1.5 micrometer thick resist layer and a completed work article.

A pattern was then exposed into resist layer through a photo mask having a line width of 10 micrometers using a Model 8160 Exposure Station from Oriel Corporation of Stratford, Conn. and a dosage of 15–20 milliwatts/square centimeter for 10–20 seconds. Resist layer was developed by a Kodak 809 developer to expose a pattern. Workpiece was then blanket exposed. Workpiece was then immersed in 50% volume/volume nitric acid for five seconds to chemically etch uncovered portions of the silver blocking layer. Remaining portions of resist layer were then developed by the same developer. Ion implantation was then performed using an unfocused ion beam of $5'10^{14}$ boron ions/centimeter$^2$ at 400 KeV, having a beam diameter of between about 0.6 centimeters and about 1.0 centimeters at the surface of precursor film and a scanning area of 142 square centimeters. The current density of ion implantation was 3.2 microAmps/125 square centimeters. The ion beam irradiation made the unblocked portions of precursor film insoluble in 2-ethylhexanoic acid. The implant energy was selected to provide full penetration through unblocked portions of protective layer and then through unblocked portions of precursor film, but no penetration into blocked portions of protective layer and precursor film. Following implantation, workpiece was immersed in 50% volume/volume nitric acid for five seconds to chemically etch remaining portions of blocking layer. Workpiece was then soaked in a 1% volume/volume solution of 2-ethylhexanoic acid in the solvent acetone for 10 seconds with mild agitation to remove unirradiated portions of protective layer. Workpiece was subsequently soaked in a 10% volume/volume solution of 2-ethylhexanoic acid in the solvent xylene for less than 10 seconds with mild agitation to remove unirradiated portions of precursor film. After rinsing in toluene and nitrogen drying, irradiated portions of precursor film were examined by scanning electron microscopy, which revealed regular lines having a line width of 10 micrometers.

EXAMPLE 2

The same procedures were followed as in EXAMPLE 1, with the exceptions that the precursor solution was layered on a MgO(xtal) substrate. Scanning electron microscopy revealed regular lines having a line width of 10 micrometers. The workpiece was subsequently heated in air at 865 degrees C. for 20 minutes. Scanning electron microscopy revealed no degradation of the patterned structure. X-ray diffraction analysis was performed. $Bi_2Sr_2CaCu_2O_{8+x}$ was the only phase shown in x-ray diffraction patterns and only (001) peaks were visible, indicating that the film was highly oriented.

EXAMPLE 3

The same procedures were followed as in EXAMPLE 2, with the following exceptions. Instead of $Bi_2Sr_2CaCu_2O_{8+x}$ precursor solution, $Pb(Zr_{0.47}T_{0.53})$ precursor solution was used. The substrate was Si overlayered with a $BaF_2$ layer having a thickness of about 200 nanometers to act as a diffusion barrier between Si and $Pb(Zr_{0.47}Ti_{0.53})O_3$ produced during high temperature processing. The $BaF_2$ layer was produced by electron beam evaporation in a vacuum system. Scanning electron microscopy revealed regular lines having a width of about 10 micrometers. The workpiece was subsequently heated in air at 650 degrees C. for 30 minutes. Scanning electron microscopy revealed no degradation of the patterned structure. X-ray diffraction analysis showed only a single phase of $Pb(Zr_{0.47}Ti_{0.53})O_3$.

COMPARATIVE EXAMPLE 1

The same procedures were followed as in EXAMPLE 1 for the preparation of precursor solution. Precursor solution was spin coated on Si (100) at 4000 revolutions per minute and baked at 150 degrees C. for 20 minutes to provide precursor film having a thickness of 3.0 micrometers. A layer of Kodak 809 photoresist was then prepared by spin coating over precursor film, at 5000 revolutions per minute for 30 seconds. A pattern was then exposed into the layer of resist. Resist layer was developed by 809 developer to expose a pattern. Scanning electron microscopy showed morphological degradation of the precursor film occurred where the layer of resist was removed by development, due to interaction between the precursor film and the base developer. The workpiece was washed in a 10% volume/volume solution of 2-ethylhexanoic acid in the solvent xylene and it was determined that the reacted areas of precursor film acted as a barrier inhibiting dissolution of the precursor film.

COMPARATIVE EXAMPLE 2

The same procedures were followed as in COMPARATIVE EXAMPLE 1, with the exception that the photoresist used was AZ 4620 having 1% weight/weight based upon solvent, imidazole. The photoresist was spun on the substrate at 3000 revolutions per minute and baked at 120 degrees C. for 2 minutes. A pattern was then exposed into the layer of resist at a dosage of 0.4 Joules/square centimeter. The workpiece was then heat treated at 100 degrees C. for 30 minutes, rendering the exposed portions insoluble. The workpiece was then subject to a blanket exposure to render the previously unexposed portions of the photoresist soluble without altering the previously exposed portions. Resist layer was developed to expose an image reversed pattern having undercut sidewalls. Development of the layer of resist was found to be incomplete due to an apparent interaction of precursor and resist.

COMPARATIVE EXAMPLE 3

The same procedures were followed as in COMPARATIVE EXAMPLE 2, with the exception that a layer of isopropylacrylamide (N(3-aminopropyl)methacrylamide)$_x$ ($IM_X$) was spin coated over the layer of precursor at 5000 revolutions per minute and baked at 100 degrees C. for 30 minutes to provide a layer having a thickness of about 100 nanometers and the photoresist was deposited over the $IM_X$ layer. Development of the layer of resist was found to be incomplete due to the interaction between $IM_X$ and resist.

COMPARATIVE EXAMPLE 4

Layers were deposited in the order necessary for a lift off process. A layer of Kodak 809 positive photoresist was spin coated over Si (100), at 1000 revolutions per minute for 30 seconds and was baked at 90 degrees C. for 5 minutes. This process was repeated for additional layers of Kodak 809 photoresist until a 6 micrometer thick layer of resist had been built up. A pattern was then exposed in the layer of resist and developed. $Bi_2Sr_2CaCu_2O_{8+x}$ precursor solution was spin coated over the patterned layer of resist at 4000 revolutions per minute and baked at 130 degrees C. for 20 minutes to provide precursor film having a thickness of about 2 to 3 micrometers. A 100 nanometer thick layer of $IM_X$ was then deposited over the layer of precursor to protect against acetone attack during lift off. Lift off was performed by spraying with acetone or by immersion in acetone accompanied by ultrasonic agitation. Scanning electron microscopy showed severe pattern degradation due to inappropriate retention of precursor film in some regions and inappropriate removal of precursor film in other regions.

COMPARATIVE EXAMPLE 5

The same procedures were followed as in COMPARATIVE EXAMPLE 4, with the exception the thickness of the layer of precursor was 1 to 2 micrometers. Inappropriate removal and retention of precursor film was observed.

COMPARATIVE EXAMPLE 6

The same procedures were followed as in COMPARATIVE EXAMPLE 4, with the exception the thickness of the layer of precursor was between about 0.5 and about 1.0 micrometers. This thickness is considered too thin to be useful. Scanning electron microscopy revealed no degradation of the pattern structure, but the film was nonuniform in thickness across the pattern structure.

COMPARATIVE EXAMPLE 7

The same procedures were followed as in COMPARATIVE EXAMPLE 1, with the following exceptions. A layer of $IM_X$ was spin coated over the layer of resist at 5000 revolutions per minute and baked at 100 degrees C. for 30 minutes. It was determined by optical microscopy that the $IM_X$ layer had reacted with resist to form an interfacial layer, which prevented removal of any portions of precursor film.

COMPARATIVE EXAMPLE 8

A layer of precursor was deposited on Si substrate in the same manner as in COMPARATIVE EXAMPLE 1. A layer of $IM_X$ was spin coated over the layer of precursor at 5000 revolutions per minute and baked at 100 degrees C. for 30 minutes to provide a layer having a thickness of about 0.1 micrometers. It was proposed that the $IM_X$ layer might provide protection of the precursor film during development of a resist layer. A layer of AZ 4620 positive photoresist by American Hoechst Corporation of Somerville, N.J., was then prepared by spin coating over the $IM_X$ layer, at 3000 revolutions per minute for 30 seconds to provide a layer having a thickness of about 7.5 micrometers. A pattern was then exposed into the layer of resist. Resist layer was developed to expose a pattern. The workpiece was then subject to ion beam irradiation of $5 \times 10^{14}$ boron ions/centimeter$^2$ at 390 KeV. It was proposed that the layer of resist would act as a mask. Workpiece was then soaked in acetone to remove remaining portions of the layer of resist. Removal of the layer of resist was found to be extremely difficult and it was necessary to continue soaking the workpiece in acetone for 1-2 minutes with ultrasonic agitation. The workpiece was subsequently soaked in a 10% volume/volume solution of 2-ethylhexanoic acid in the solvent xylene, however, regions of precursor film were inappropriately retained and could not be removed. It is believed that the difficult resist strip was due to formation of a carbonized layer on sidewalls of the resist and that the prolonged acetone soak attacked unirradiated precursor film and rendered it insoluble in 2-ethylhexanoic acid.

COMPARATIVE EXAMPLE 9

The same procedures were followed as in COMPARATIVE EXAMPLE 1 for the preparation of a workpiece layered with precursor and resist with respective thicknesses of 3.0 micrometers and 300 nanometers. A layer of elemental silver was then deposited by electron beam evaporation of elemental silver onto the resist layer to provide a 30 to 60 nanometer thick silver layer. A second layer of resist was then deposited by spin coating over the silver layer, at 3000 revolutions per minute for 30 seconds, a solution of AZ 4620 having 1% imidazole weight/weight based upon solvent, followed by baking at 90 degrees C. for 30 minutes, to provide a 7.5 micrometers thick top resist layer. The workpiece was then exposed and developed in the image reversal technique disclosed in Comparative Example 2, to provide undercut sidewalls. Workpiece was then immersed in 50% volume/volume nitric acid for five seconds to chemically etch uncovered portions of the silver layer. Ion implantation was then performed using an ion beam of $5 \times 10^{14}$ boron ions/centimeter$^2$ at 390 KeV, having a beam diameter of between about 0.6 centimeters and about 1.0 centimeters at the level of remaining portions of blocking layer. Following implantation, workpiece was washed in acetone for 5 to 10 seconds with mild agitation to remove remaining portions of the layer of resist. The top resist was observed to be readily removed, however, inappropriate removal of silver and the bottom resist layer and inappropriate exposure of portions of the precursor film was also noted. A subsequent chemical etching of the workpiece, by immersion in 50% volume/volume nitric acid for five seconds, rendered those exposed portions of the layer of precursor insoluble in 2-ethylhexanoic acid.

Metallo-organic precursors interact chemically with a variety of materials. The invention overcomes these interactions in a way that is novel and surprising. $Bi_2Sr_2CaCu_2O_{8+x}$ precursor film and a number of other metallo-organic precursor films interact with acetone, the developer of many photoresists, such as Kodak 809 and AZ 4620. As Comparative Example 1 demonstrates, when Kodak 809 resist was layered over a $Bi_2Sr_2CaCu_2O_{8+x}$ precursor film, exposed and then developed, areas of the precursor film become insoluble, preventing patterning of the precursor film. A similar result is seen when AZ 4620 positive resist with one percent imidazole was layered over $Bi_2Sr_2CaCu_2O_{8+x}$ precursor film, as disclosed in Comparative Example 2, although it is believed that the interaction in that case was between the resist and the precursor film. The problem was improved, but, surprisingly, not eliminated by placement of a polymer layer between the resist and the precursor film, in Comparative Example 3.

Use of a lift off process did not resolve the problem. A pattern is developed in a lift off process by removal of areas of resist and overlaying precursor with acetone. In Comparative Examples 4-6, Kodak 809 resist was deposited on the substrate and was covered by precursor film and a layer of the polymer isopropylacrylamide (N(3-aminopropyl)methacrylamide)$_x$ ($IM_X$), which does not react with the precursor film and only slightly reacts with acetone. $IM_X$ does react with Kodak 809 resist, as demonstrated in Comparative Example 7. Surprisingly, when the lift off process was attempted, in Comparative Examples 4 and 5, severe pattern degradation resulted, due to inappropriate retention of precursor film in some regions and inappropriate removal of precursor film in other regions. Reduction of the precursor film thickness below that considered useful, in Comparative Example 6, protected the pattern, but resulted in non-uniform precursor film thickness.

A similar effect was seen in Comparative Example 8, which utilized ion patterning through a resist stencil. $Bi_2Sr_2CaCu_2O_{8+x}$ precursor film was layered over substrate, covered by a thin layer of $IM_X$ and then covered by a layer of AZ 4620 photoresist. Resist strip using acetone was extremely difficult due to reduced solubility of outer portions of the resist, apparently caused by the ion beam irradiation. Portions of the precursor layer were found to have been rendered insoluble by the developer.

In Comparative Example 9, interactions with the precursor layer during resist development were solved. The polymer layer of Comparative Example 6 was replaced by a lower layer of resist and a thin silver layer between the two resist layers. A new problem was observed, in Comparative Example 9, in that some of the silver layer and bottom resist layer were removed during removal of the upper resist layer with acetone and ultrasonic agitation, exposing precursor to the etching agent used during removal of the silver layer.

In the invention, these problems are solved. It is believed that the invention operates in accordance with the following explanation, however, unless specifically claimed, the scope of the claims is not limited by an explanation or theory of the operation of the invention. Blocking layer both blocks beam 44a and protects precursor layer from upper resist layer and its developer. This means that blocking layer must be relatively thick, at least in comparison to the silver layer of Comparative Example 9. Since the upper resist layer does not block the ion beam it can be relatively thin in comparison to the upper resist layer of Comparative Example 9. This provides surprisingly good results. What is also surprising is that protective layer can be removed by a solvent system consisting of a solvent, which, if used alone, would render precursor film insoluble; along with a small amount of another solvent, which if used in greater concentration, would dissolve precursor layer. It is believed that the principle solvent, for example, acetone, in the solvent system attacks the unirradiated precursor film to a limited extent, but that such insoluble areas are rapidly removed due to solubilization of surrounding areas of precursor film by the secondary solvent, for example, 2-ethylhexanoic acid.

The invention has been described in detail with particular reference to a preferred embodiment thereof, but it will be understood that variations and modifications can be effected within the spirit and scope of the invention.

What is claimed is:

1. A method for producing a patterned ceramic or metal film comprising:

producing a metallo-organic decomposition film, said decomposition film being soluble under first solvent etching conditions, said decomposition film being capable of being rendered insoluble under said first solvent etching conditions by ion implantation, depositing a protective layer over said decomposition film, said protective layer being soluble under second solvent etching conditions and substantially insoluble under said first solvent etching conditions, said protective layer being capable of transmitting an ion beam sufficiently energetic to fully implant said decomposition film, depositing a metal blocking layer over said protective layer, said blocking layer being capable of blocking said ion beam, said blocking layer being soluble under said first solvent etching conditions, said blocking layer being substantially insoluble under third solvent etching conditions, depositing a photoresist layer over said blocking layer, exposing said photoresist layer to a photolithographic light source, with a photo mask interposed between said photoresist layer and said photolithographic light source, to produce a latent image, solvent etching said photoresist layer under said third solvent etching conditions to develop said latent image into a pattern in which portions of said blocking layer are covered by said photoresist and portions of said blocking layer are uncovered, solvent etching uncovered portions of said blocking layer under said first solvent etching conditions to produce a patterned blocking layer and uncover portions of said protective layer, removing remaining portions of said resist layer, ion implanting said patterned blocking layer, said uncovered portions of said protective layer and portions of said decomposition film underlying uncovered portions of said protective layer, solvent etching under said first etching conditions to remove remaining portions of said blocking layer, solvent etching under said second etching conditions to remove portions of said protective layer covered by said blocking layer during said ion implanting, solvent etching under said first etching conditions to remove portions of decomposition film covered by said blocking layer during said ion implanting, and annealing said ion implanted portions of said decomposition film in an oxidizing atmosphere to produce said patterned film.

2. The method of claim 1 wherein said metallo-organic decomposition film is selected from the group consisting of 2-ethylhexanoates, octanoates, resinates, oleates, naphthenates, and heptanoates.

3. The method of claim 2 wherein said blocking layer further comprises silver.

4. The method of claim 3 wherein said ion beam has a beam energy from 10 to 400 keV.

5. The method of claim 4 wherein said ion beam has an ion dosage from $10^{13}$ to $10^{16}$ ions per square centimeter.

6. The method of claim 1 wherein said metallo-organic decomposition film is a decomposition precursor of a material selected from the group consisting of $YBa_2Cu_3O_{7-x}$, where x=0–0.6, $Bi_2SrCaCu_2O_8$, $Bi_2Sr_2Ca_2Cu_3O_{10}$, $Tl_2Ba_2CaCu_2$ oxide, $Tl_2Ba_2Ca_2Cu_3$ oxide, $LiNbO_3$, $LiTaO_3$, $KNbO_3$, ZnO, $KTiPO_4$, beta barium borate, $BaTiO_3$, strontium barium niobate, $Fe:LiNbO_3$, Au, Pt, Ag, $SrTiO_3$, MgO, and $ZrO_2$.

* * * * *